(12) United States Patent
Wu

(10) Patent No.: US 9,126,829 B2
(45) Date of Patent: Sep. 8, 2015

(54) GRAPHENE VALLEY SINGLET-TRIPLET QUBIT DEVICE AND THE METHOD OF THE SAME

(75) Inventor: Yu-Shu Wu, Hsin Chu (TW)

(73) Assignee: National Tsing Hua University, Hsinchu (TW)

( * ) Notice: Subject to any disclaimer, the term of this patent is extended or adjusted under 35 U.S.C. 154(b) by 58 days.

(21) Appl. No.: 13/350,135

(22) Filed: Jan. 13, 2012

(65) Prior Publication Data

US 2013/0057333 A1    Mar. 7, 2013

(30) Foreign Application Priority Data

Sep. 2, 2011    (TW) .............................. 100131783 A

(51) Int. Cl.
| | |
|---|---|
| H01L 29/06 | (2006.01) |
| B82Y 10/00 | (2011.01) |
| H01L 29/66 | (2006.01) |
| H01L 29/16 | (2006.01) |

(52) U.S. Cl.
CPC ........... *B82Y 10/00* (2013.01); *H01L 29/66984* (2013.01); *H01L 29/1606* (2013.01)

(58) Field of Classification Search
USPC .................................... 257/E51.04, E51.038
See application file for complete search history.

(56) References Cited

U.S. PATENT DOCUMENTS

| | | | | |
|---|---|---|---|---|
| 2010/0127243 | A1* | 5/2010 | Banerjee et al. ................. | 257/39 |
| 2011/0006837 | A1* | 1/2011 | Wang et al. .................... | 327/539 |
| 2011/0108806 | A1* | 5/2011 | Davidovic et al. .............. | 257/29 |

OTHER PUBLICATIONS

Theory of Spin qubits in nanostructures Bjorn Trauzettel, Massoud Borhani, Mircea Trif and Daniel Loss, Department of Physics and Astronomy, University of Basel, Switzerland( Aug. 2007).*
G. Y. Wu et al., "Graphene quantum dots for valley-based quantum computing: A feasability study", (arXiv 1104.0443 cond-mat.meshall Apr. 4, 2011) pp. 1-19.

* cited by examiner

*Primary Examiner* — Selim Ahmed
*Assistant Examiner* — Moin Rahman
(74) *Attorney, Agent, or Firm* — Chih Feng Yeh; Huntington IP Consulting Co., Ltd.

(57) ABSTRACT

The present invention is to provide a graphene valley singlet-triplet qubit device. The device includes a substrate, and a graphene layer formed on the substrate. An energy gap is created between the valence band and the conduction band of the graphene layer. At least one electrical gate is configured on the graphene layer and/or on two sides of the graphene layer. The graphene layer is located in a magnetic field and a voltage is applied to at least one electrical gate, thereby creating a valley singlet-triplet qubit.

6 Claims, 5 Drawing Sheets

GRAPHENE VALLEY SINGLET-TRIPLET QUBIT DEVICE AND THE METHOD OF THE SAME

FIELD OF THE INVENTION

The present invention relates a qubit device, and more specifically to a graphene valley singlet-triplet qubit device and its operation process that can be applied to applications of carbon-based quantum computing or quantum communication.

BACKGROUND OF THE INVENTION

Quantum mechanical systems have been investigated for many applications including quantum cryptography and quantum computation. Information may be stored and processed in such a quantum system. Often the information is carried by two-state quantum subsystems. Each two-state quantum subsystem is called a quantum bit (qubit).

Quantum bit can be applied to quantum computers. The quantum mechanical state of a physical system represents the logical state of the computers. Such a computer is called a "quantum computer" and the logical gates in such a computer are called "qubits". A quantum computer would be able to solve certain types of problems far more rapidly than any conceivable classical computer. For example, such tasks as searching, encryption, and searching a large database for the optimal solution to a multidimensional optimization problem would be orders of magnitude faster on a quantum computer.

The reason for this drastic increase in capability is the following. In an ordinary classical computer, the logical state of the computer is represented by "0"s and "1"s, or in other words, the classical states of a physical system. Therefore, the basic logic gate in the classical computer stores a single bit of information. In contrast, a qubit simultaneously stores multiple bits of information.

At the center of quantum computing realization is the physical implementation of qubits, two-state quantum information units. The rise of graphene has opened a new door to the implementation. Because graphene electrons simulate two-dimensional relativistic particles with two degenerate and independent energy valleys, a novel degree of freedom (d.o.f.), namely, the valley state of an electron, emerges as a new information carrier.

A fundamental issue of physical implementation of qubits is that a quantum system with information carriers suffers from environment-caused fluctuation and the encoded quantum information may be lost in the environment due to decoherence. In addition, following the example of conventional microelectronics, one would like to manipulate qubits with purely electrical means, as well as fabricate scalable and fault-tolerant circuits for quantum computing. To sum up, a qubit implementation faces three important issues, namely, i) all electrical manipulation, ii) state relaxation/decoherence, and iii) scalability and fault tolerance. In the spin qubit case (where the logic 0/1 states are represented by the spin "up or down" states), the paradigm quantum dot (QD) approach (using confined electron spins) usually serves as the foundation (referred to: D. Loss and D. P. DiVincenzo, Quantum computation with quantum dots, Phys. Rev. A. 57, 120 (1998); G Burkard, D. Loss, and D. P. DiVincenzo, Coupled quantum dots as quantum gates, Phys. Rev. B 59, 2070 (1999).), upon which one applies the additional tactics including: utilization of the Rashba mechanism of spin-orbit interaction (SOI) to achieve i), materials with weak SOI and vanishing hyperfine field (HF), e.g., graphene or carbon nanotube (CNT), to resolve ii), and spin singlet-triplet qubits to iii).

Being solutions to separate issues, these tactics are sometimes at odds with one another, in a material-dependent way. For instance, in materials with strong Rashba SOI, HF or SOI inevitably cause state mixing (referred to: A. V. Khaetskii and Y. V. Nazarov, Spin relaxation in semiconductor quantum dots, Phys. Rev. B 61, 12639 (2000).; T. Meunier et al., Experimental signature of phonon-mediated spin relaxation in a two-electron quantum dot, Phys. Rev. Lett. 98, 126601 (2007).; A. Pfund et al., Spin-state mixing in InAs double quantum dots, Phys. Rev. B. 76, 161308, (2007).). For this reason, varied materials, e.g., GaAs (referred to: J. Pella et al., Coherent manipulation of coupled electron spins in semiconductor quantum dots, Science 309, 2180 (2005).; F. H. L. Koppens et al., Driven coherent oscillations of a single electron spin in a quantum dot, Nature 442, 766 (2006).; K. C. Nowack et al., Coherent control of a single electron spin with electric fields, Science 318, 1430 (2007).), CNT (referred to: H. Ingerslev et al., Singlet-triplet physics and shell filling in carbon nanotube double quantum dots, Nature Phys. 4, 536 (2008).), or InAs (referred to: S. Nadj-Perge et al., Spin-orbit qubit in a semiconductor nanowire, Nature 468, 1084 (2010).), have been exploited, in the recent experimental breakthroughs in spin qubit demonstration.

As mentioned above, in prior research and development of qubits, the utilization of certain semiconductor materials or CNT may overcome some of the issues that spin qubits are facing. However, such solutions are incomplete. Take CNT for example, because of weak SOI and HF in CNT, electron spin qubits in this material can have long coherence time. However, the weak strength of SOI in CNT also makes it hard to manipulate spin qubits by electrical means.

The present invention provides a carbon-based qubit device, namely, the graphene valley singlet-triplet qubit that can improve in all of the issues in spin qubits (i-iii in [0006]) and the three corresponding tactics resolving these issues can be fully realized (in their "valley" version) without conflict with one another.

SUMMARY OF THE INVENTION

One objective of the present invention is to provide for a graphene valley singlet-triplet qubit device. A graphene layer is formed on such a substrate that opens an energy gap between the valence band and the conduction band of the graphene layer. Vertical and/or two-side electrical gates are placed above, below or in the graphene layer. The graphene layer is positioned in a tilted magnetic field and voltages are applied to two of the vertical gates which sit side by side, thereby creating a valley singlet-triplet qubit.

Examples of the substrate can be SiC or BN. Two vertical electrical gates (A and B) which sit side by side are required and located above or below the graphene layer, together with the following optional electrical gates: one or two pairs of two-side electrical gates ($V_L$ and $V_R$) in the graphene layer, and one vertical gate (V') between the two vertical gates A and B. The vertical gates A and B are biased to provide quantum confinement of electrons and form quantum dots. The optional two-side electrical gates ($V_L$ and $V_R$) are located by the quantum dots and biased to create a DC or AC electric field in the quantum dots. A magnetic field is applied to the graphene layer, which comprises a first magnetic field component (the normal component) normal to the graphene plane, and a second magnetic field component (the in-plane component) parallel to the graphene plane. The in-plane component is required to be much larger than the normal component.

The present invention provides a graphene valley singlet-triplet qubit device as well as a method for manipulating the qubit device. An electron state in graphene is characterized by its energy valley (K or K') and spin (up or down) as well. By applying voltages on the two vertical gates (A and B), two quantum dots are created due to the electrostatic modulation of energy bands of the graphene layer, with each quantum dot trapping exactly one electron (or hole). The description below focuses on the electron case but with slight modification it also applies to the hole case. By applying the magnetic field, the spin degeneracy of each quantum dot electron is removed. The normal component of magnetic field further splits away the two-electron states where the two electrons have the same energy valley character (e.g., the states |KK> and |K'K'>), leaving only the two-electron states, namely, the valley singlet and triplet states as qubit states. That is, the valley singlet and triplet states are used to represent the logic 0 and 1 states, respectively. Next, by adjusting the voltages on gates A and/or B, and/or the voltage on gate V', it permits the control of the exchange interaction between the two quantum dot electrons. By adjusting voltages on the vertical gates A and/or B, and/or the two-side gates $V_L$ and $V_R$, it permits the control of the orbital magnetic moment difference between the two quantum dot electrons. By controlling both the exchange interaction and the magnetic moment difference, it permits the manipulation of the qubit into a pre-determined qubit state, via the modulation of the gate voltages.

DETAILED DESCRIPTION OF THE PREFERRED EMBODIMENT

The invention will now be described in greater detail with preferred embodiments of the invention and illustrations attached. Nevertheless, it should be recognized that the preferred embodiments of the invention is only for illustration. Besides the preferred embodiment mentioned here, the present invention can be practiced in a wide range of other embodiments besides those explicitly described, and the scope of the present invention is expressly not limited except as specified in the accompanying Claims.

Graphene has the novel property that its electrons belong to two degenerate and inequivalent energy valleys, and the valley degree of freedom may be utilized to encode quantum information. That is, the present invention can be applied in quantum computing and quantum communication based on energy valleys. In the present invention, double quantum dot structures are designed in gapped graphene as valley qubits, with the logic 0/1 states represented by the "valley" singlet/triplet pair. The proposed qubit is characterized by 1) qubit coherence time~order of milliseconds, and 2) qubit manipulation in the time scale of nanoseconds, based on the unique 1st-order "relativistic effect" in gapped graphene. Besides, the qubit in the present invention is a device with electrical gates, and can be electrically manipulated via the application of voltages to the gates. The qubit proposed here is expected to have a great potential in the future applications of carbon-based quantum computing/quantum communication.

The present invention provides a qubit device; that is a memory device for performing quantum computations. Quantum information is stored in the qubit and the qubit can be manipulated into any pre-determined qubit state, by selective application of voltages to the gates and selective application of a static magnetic field to the qubit.

The device of present invention is based on double quantum dot structures in gapped graphene. Device structure and working principle are explained below.

Figure 1:
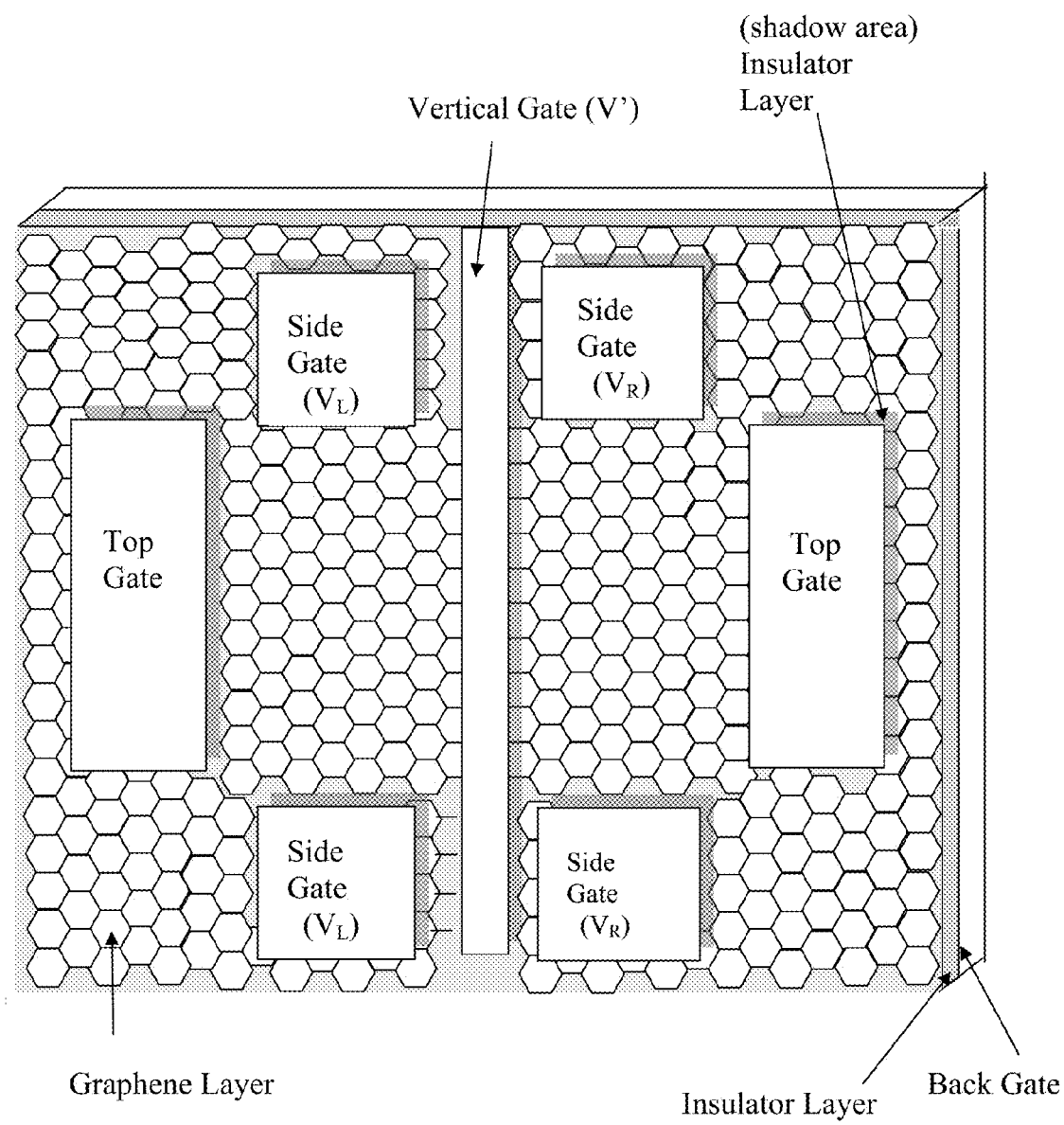
FIG. 1 shows the double quantum dot qubit structure in gapped graphene according to the present invention. The vertical gates A and B are located above or below the two quantum dots, but are not shown here.

FIG. 1 shows a double quantum dot qubit structure in gapped graphene. The graphene is epitaxially grown on a SiC or BN substrate to form a graphene layer. An energy gap ($2\Delta$) is opened (created) between the valence band and the conduction band of the grapheme layer. The energy gap is used to confine electrons. The substrate material can be SiC or BN, but not limited to these two. In one embodiment, a graphene layer is situated on the substrate, two vertical top gates (shown in FIG. 1) are located under the substrate, which define the two quantum dots. An electrical gate (V') is disposed on the graphene layer, and two-side electrical gates ($V_L$ and $V_R$) are located by the side of the two graphene quantum dots.

In the double quantum dot qubit structure, one electron is residing in each quantum dot. In the absent of magnetic field, each quantum dot is assumed to accommodate only one bound state (with both spin and valley degeneracy). A selective static magnetic field is used to lift the spin degeneracy.

In the double quantum dot qubit structure, the quantum dots are electrostatically defined by top gates (A and B). V' is used to tune the barrier height between the (two) quantum dots, and hence tune the inter-dot tunneling. This controls J ($J=4t_{d-d}^2/U$ called the exchange interaction energy, U=on-site Coulomb energy, $t_{d-d}$=tunneling energy). $V_L$ or $V_R$ are applied to tune the magnetic moment difference, ($\mu_{vL}-\mu_{vR}$). $\mu_{vL}$ and $\mu_{vR}$ are the orbital magnetic moments of electrons in the two (left and right) quantum dots, respectively.

Figure 2:
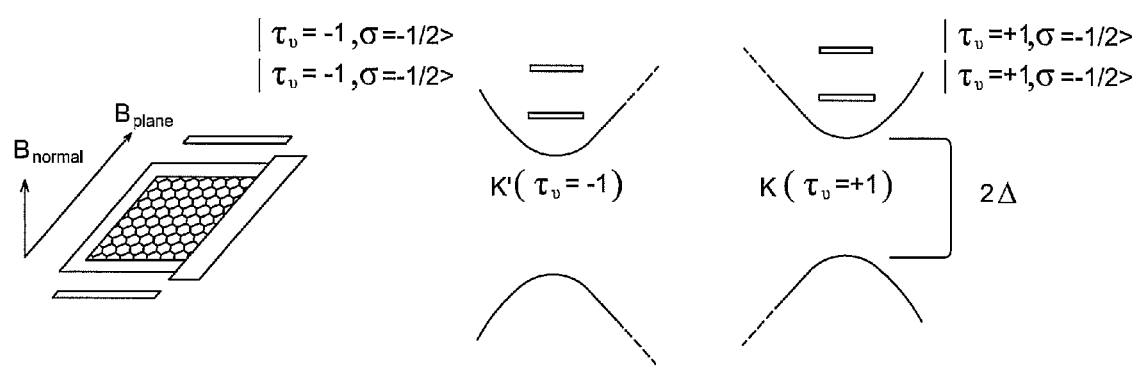
FIG. 2 shows the various one-electron energy levels of the double quantum dot qubit placed in a tilted static magnetic field according to the present invention.

As shown in FIG. 2, a gapped graphene electron belongs to one of the two energy valleys (K' and K). $\tau_v$ is the valley index. $\tau_v=-1$ denotes the K' valley and $\tau_v=1$ denotes the K valley. $\sigma=\pm\frac{1}{2}$ is the spin index denoting the spin of an electron quantized along the magnetic field. $B_{normal}$ is the normal component of the magnetic field and $B_{plane}$ is the in-plane component of the magnetic field. The electron simulates a massive Dirac particle, with the dispersion $E=\pm(\Delta^2+v_F^2p^2)$, where E=energy, p=momentum, $\Delta$=energy gap, $v_F$=Fermi velocity.

The electron carries a valley-dependent orbital magnetic moment $\tau_v\mu_v$. $\mu_v$ is the magnitude of electron orbital magnetic moment. The 1st-order relativistic type correction in $\mu_v$ (denoted as $\mu_v^{(1)}$) is energy dependent, with $\mu_v^{(1)}/\mu_v$~the order of $[(|E|-\Delta)/\Delta]$.

An electric field (in DC or AC modes) can be used to shift the energy of a confined electron in the quantum dot, and thereby control $\mu_v$ (or $\mu_v^{(1)}$). The electric field is produced by the two-side gates ($V_L$, $V_R$). Because of the $1^{st}$-order relativistic type effect on $\mu_v$, this modulates $\mu_v$. The modulation of $\mu_v$ can also be achieved by tuning of the quantum dot confinement via top gates (A, B).

As shown in FIG. 2, the whole structure is placed in a tilted static magnetic field $B_{total}=B_{normal}+B_{plane}$. $B_{normal}$ is normal to the grapheme plane, and $B_{plane}$=in-plane component. In the absence of magnetic field, a graphene electron carries both spin and valley degeneracy. $B_{total}$ is used to remove spin degeneracy. $B_{plane}$ couples only to the electron spin but not $\mu_v$. $B_{normal}$ couples to the electron spin as well as to $\mu_v$. The coupling between $B_{normal}$ and $\mu_v$ gives the interaction $H_Z=\tau_v\mu_v|B_{normal}|$.

Figure 3:
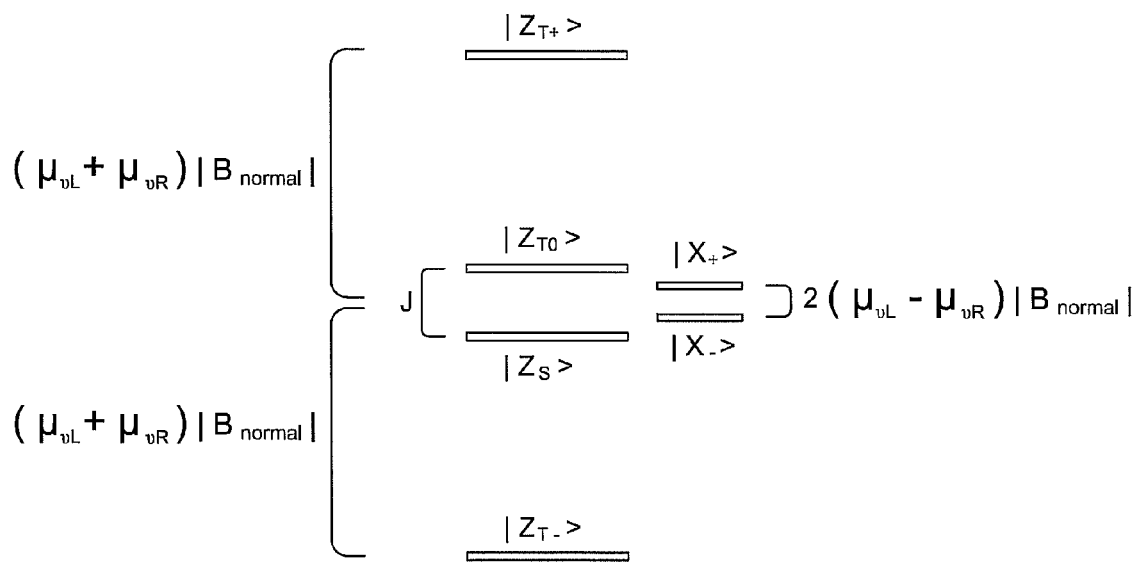
FIG. 3 shows the valley singlet and triplet states of the double quantum dot qubit according to the present invention.

The qubit state is an interacting two-electron state and operates in the low-energy sector. In the sector, the two electrons are separately confined in the quantum dots, and interact with each other. The interaction is described by the exchange interaction $H_J=\frac{1}{4}J\tau_{vL}\cdot\tau_{vR}$, where J=exchange interaction energy, $\tau_{vL}$ and $\tau_{vR}$ are the corresponding Pauli "valley" operators (analogue of spin operators). The logic 0/1 states are represented by the two-electron "valley" singlet ($Z_S$)/triplet ($Z_{T0}$) states, as shown in FIG. 3. Symmetric/antisymmetric combinations of $Z_S$ and $Z_{T0}$ form the states "X+" and "X−", respectively. The state space expanded by $Z_S$ and $Z_{T0}$ (denoted as $\Gamma_v$) is isomorphic to the spin-½ state space, e.g., $Z_S \leftrightarrow |S_Z=\frac{1}{2}\rangle$, $Z_{T0} \leftrightarrow |S_Z=-\frac{1}{2}\rangle$, $X+ \leftrightarrow |S_X=\frac{1}{2}\rangle$, $X- \leftrightarrow |S_X=-\frac{1}{2}\rangle$. The additional two-electron states $Z_{T+}$ and $Z_{T-}$, where the two electrons have the same valley character, are not needed for the function of the qubit device.

As shown in FIG. 3, $Z_S$ and $Z_{T0}$ are separated by J (in energy), X+ and X− by $2(\mu_{vL}-\mu_{vR})|B_{normal}|$. Apart from the valley singlet $|Z_S\rangle$ and triplet $|Z_{T0}\rangle$, other states shown here are $|z_{T+}\rangle=|KK\rangle$, $|z_{T-}\rangle=|K'K'\rangle$, $|x_+\rangle=|KK'\rangle$, $|x_-\rangle=|K'K\rangle$. The two-electron states $Z_{T+}$ and $Z_{T-}$ (not needed for the function of the qubit device) are split away from the qubit states ($Z_S$ and $Z_{T0}$) by $\pm(\mu_{vL}+\mu_{vR})|B_{normal}|$, respectively. $\mu_{vL}$ and $\mu_{vR}$ are the magnetic moments in the two quantum dots, respectively.

Figure 4:
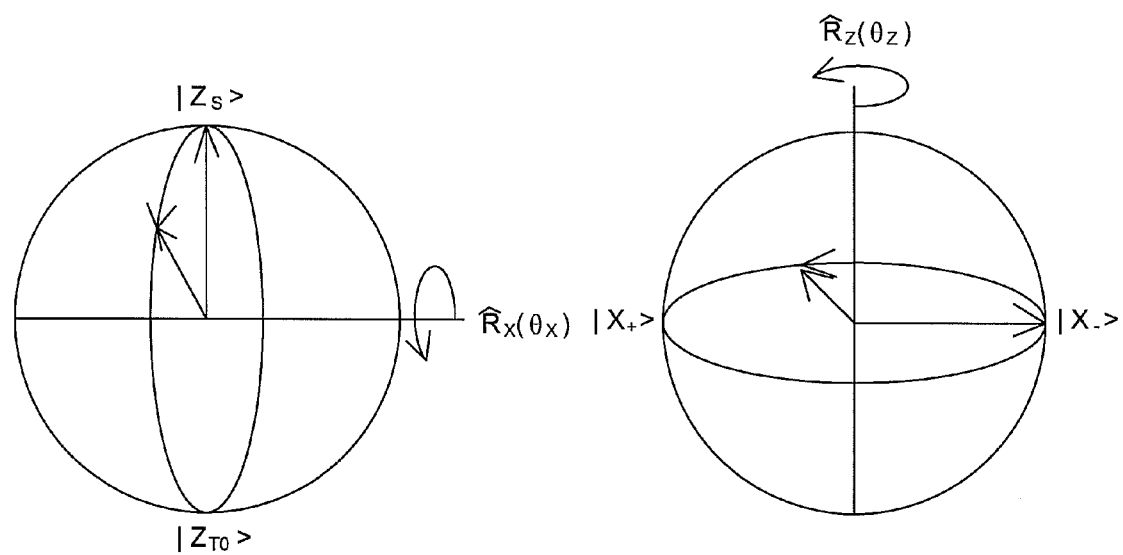
FIG. 4 shows a qubit state rotation about the x- and z-axis in the Bloch sphere according to the present invention.

The effective Hamiltonian in the qubit state space is $H_{eff}=(\mu_{vL}-\mu_{vR})|B_{normal}|\tau_x+\frac{1}{2}J\tau_z$ (in the basis of $Z_S$ and $Z_{T0}$), where $\tau_x$ and $\tau_z$ are Pauli matrices. $H_{eff}$ governs the time evolution of the qubit state. As shown in FIG. 4, the $\tau_x$ part produces a state rotation $R_x$ about the x-axis (in the Bloch sphere), and the $\tau_z$ part produces a rotation $R_z$ about the z-axis. A qubit state is represented by a point on the Bloch sphere. $R_x(\theta_x)$ denotes the rotation by an angle $\theta_x$ about the x-axis, which can be achieved by creating the orbital magnetic moment difference $(\mu_{vL}-\mu_{vR})$ (denoted as $\Delta\mu$) and maintaining it for the time length $t_x=(\hbar\theta_x)/(2\Delta\mu B_{normal})$. $R_z(\theta_z)$ denotes the rotation by an angle $\theta_z$ about the z-axis, which can be achieved by creating the exchange interaction (denoted as J) and maintaining it for the time length $t_z=(\hbar\theta_z)/(J)$. That is, $\tau_x$ part generates a rotation $R_x$ ($\theta_x=\Omega_x t_x$) about the x-axis (of the corresponding Bloch sphere) when it is applied for the time $t_x$. Here, $\Omega_x$ is the "Larmor frequency", e.g., $\Omega_x=2\Delta\mu B_{normal}/\hbar$. Similarly, $\tau_z$ part generates a rotation $R_z(\theta_z=\Omega_z t_z)$ about the z-axis ($\Omega_z=J/\hbar$, $t_z$=corresponding time). It is obvious that $\mu_{vL}\neq\mu_{vR}$ is a required condition for the existence of a finite $\tau_x$ part in $H_{eff}$ and the rotation $R_x$. There are various ways to generate this asymmetry. For example, a structural asymmetry between quantum dots via the control of top gates (A, B) or side gates ($V_L$, $V_R$) may induce a corresponding energy level difference, and hence the required $\mu_v$ asymmetry.

In the following, it describes controllable, electrical means, in DC mode and AC mode, of tuning the $\mu_v$ asymmetry.

In DC mode, a DC electric field is applied on one of the quantum dots, inducing $\delta\mu_v^{(DC)}$ (i.e., $\mu_v$ change) to create $\mu_v$ asymmetry. In AC mode, an AC electric field is superimposed on the DC electrical field. The manipulation of a qubit is described below.

We describe the DC mode of manipulation here. As mentioned above, V' is used to tune the barrier height between the quantum dots, and hence the interdot tunneling ($t_{d-d}$). This controls J ($J=4t_{d-d}^2/U$, $t_{d-d}$=tunneling energy, U=on-site Coulomb energy). $V_L$ or $V_R$ are applied to tune ($\mu_{vL}-\mu_{vR}$). Together, they can be used to tune the ratio of the two terms ($\tau_x$ and $\tau_z$) in $H_{eff}$, and hence determining the direction of the axis of rotation in the Bloch sphere. The angle of rotation is determined by the time length for which $H_{eff}$ is applied. Therefore, it permits the rotation of an initial qubit state into a predetermined target state, thus furnishing all single qubit manipulation, all electrically.

Figure 5:
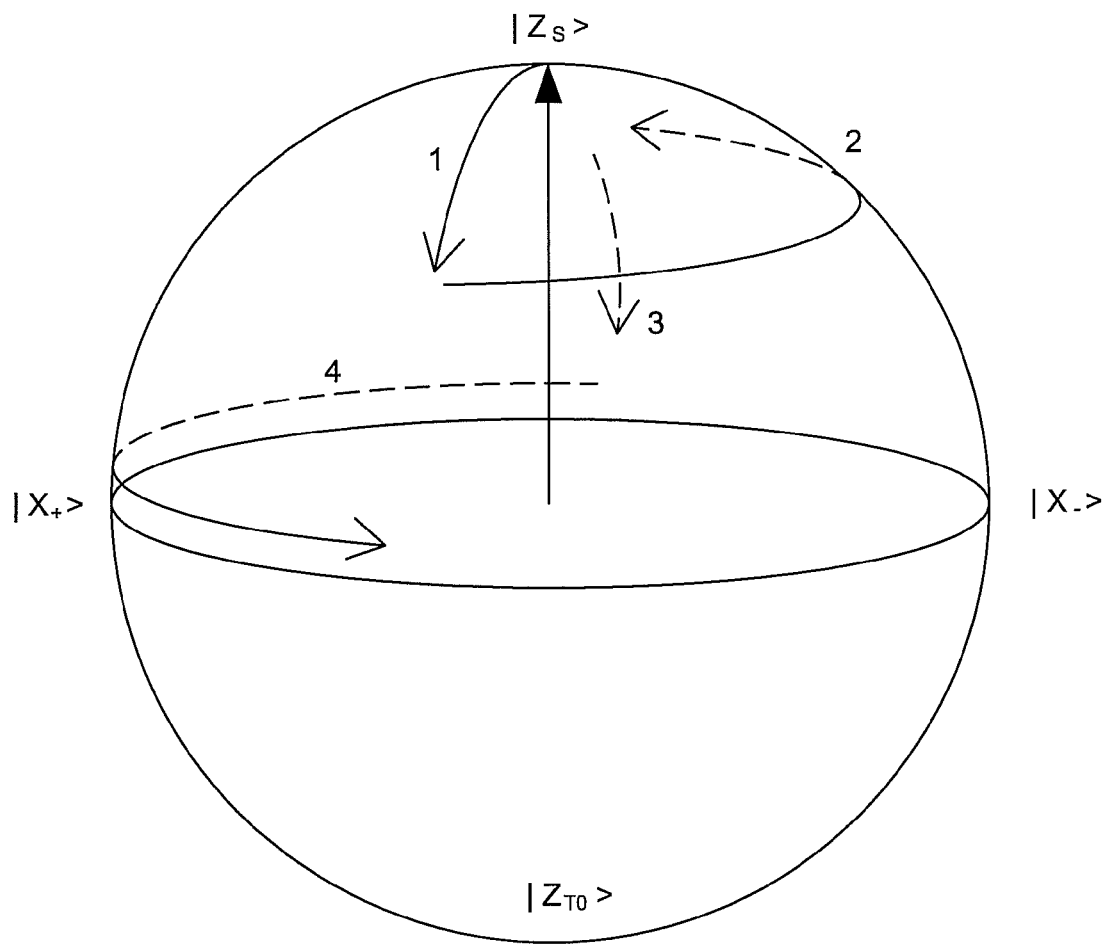
FIG. 5 shows an initial qubit state manipulated in the alternating sequence consisting of $R_x(\theta_x)$ and $R_z(\theta_z)$ in the Bloch sphere according to the present invention.

V', $V_L$ and $V_R$ can also be applied in AC modes. As shown in FIG. 5, it shows schematically how the qubit may be manipulated in the alternating sequence, in AC mode. In AC mode, the environment-caused fluctuation in the qubit state can be removed. In the AC mode, the initial qubit state, e.g., $|z_S\rangle$, may be manipulated in the alternating sequence, $R_x(\theta_x^{(AC)})\to R_z(\theta_z=\pi)\to R_x(-\theta_x^{(AC)})\to R_z(\theta_z=\pi)\to \ldots R_x(\theta_x^{(target)}+\pi/2)$ into a target state ($\theta_z^{(target)}$=target state longitude). $\theta_x^{(AC)}$ and $\theta_z$ are the angles of rotation in $R_x$ and $R_z$ in the above sequence. The slow environment-caused fluctuation in ($\mu_{vL}-\mu_{vR}$) is annihilated in the AC mode.

The confined electrons in the discussion can be replaced by confined holes, and the principle of operation for the device remains the same.

In the present invention, the related physics discussion and physics formula derivation may be referred to the inventor's published articles ("Graphene quantum dots for valley-based quantum computing: A feasibility study", G.Y. Wu, N.-Y. Lue, and L. Chang, arXiv 1104.0443 cond-mat.mes-hall Apr. 4, 2011; "Valley pair qubits in double quantum dots of gapped graphene", G.Y. Wu, N.-Y. Lue, and L. Chang, arXiv 1106.4892 cond-mat.mes-hall Jun. 24, 2011.).

In one embodiment, V', $V_L$ and $V_R$ of the present invention can be applied in either DC or AC modes. The magnetic field applied to the qubit device may be chosen to be a static magnetic field or an alternating magnetic field. Configuration of the gates and orientation of the magnetic field depend on practical applications.

In the present invention, it expands the Loss-DiVincenzo quantum dot (QD) approach in electron spin qubits, and investigates the feasibility of double QD (DQD) structures in gapped graphene as "valley qubits", with the logic 0/1 states represented by the "valley" singlet/triplet pair. This generalization of the present invention is characterized by 1) valley relaxation time ~O(ms), and 2) electric qubit manipulation in the time scale ~ns, based on the 1st order "relativistic effect" unique in graphene. Therefore, a potential for valley-based quantum computing and quantum communication in carbon-based systems is expected by utilizing qubits of the present invention.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A graphene valley singlet-triplet qubit device with double quantum dots, comprising:
   a substrate;
   a bulk graphene layer formed on said substrate, wherein an energy gap is created between the valence band and the conduction band of said bulk graphene layer; and
   two top gates configured above and one back gate configured below said bulk graphene layer and biased to provide quantum confinement of electrons to form two quantum dots, a vertical electrical gate located between said two top gates used to tune a barrier height between said two quantum dots, and two side electrical gates located by said two quantum dots and biased to tune difference of two orbital magnetic moments of electrons in said two quantum dots respectively, wherein said bulk graphene layer is located in a magnetic field and a plurality of voltages are applied to said two top gates, said back gate, said vertical electrical gate and said two side electrical gates, thereby creating a valley singlet/triplet qubit;
   wherein said two quantum dots are made on said bulk graphene layer, and confined by said vertical electrical gate and said two side electrical gates and said two top gates;
   wherein electrons of said bulk graphene layer belong to two degenerate and inequivalent energy valleys, and the valley degree of freedom is utilized to encode a quantum information;
   wherein logic 0/1 states are represented by said valley singlet/triplet qubit, respectively.

2. The device in claim 1, wherein material of said substrate comprises SiC or BN.

3. The device in claim 1, wherein said two-side electrical gates are applied to create DC or AC electric fields.

4. The device in claim 1, wherein said vertical electrical gate comprises either a single vertical gate or a pair of split gates.

5. The device in claim 1, wherein said magnetic field comprises a first magnetic field component normal to said bulk graphene layer, and a second magnetic field component parallel to said bulk graphene layer.

6. The device in claim 5, wherein said first magnetic field component is larger than said second magnetic field component.

* * * * *